(12) United States Patent
Rintala et al.

(10) Patent No.: US 10,374,344 B2
(45) Date of Patent: Aug. 6, 2019

(54) POCKET CONNECTOR

(71) Applicant: New Cable Corporation Oy, Oulu (FI)

(72) Inventors: Tommi Rintala, Oulu (FI); Antti Backman, Oulu (FI)

(73) Assignee: New Cable Corporation Oy, Oulu (FI)

( * ) Notice: Subject to any disclaimer, the term of this patent is extended or adjusted under 35 U.S.C. 154(b) by 0 days.

(21) Appl. No.: 16/030,937

(22) Filed: Jul. 10, 2018

(65) Prior Publication Data

US 2019/0020138 A1    Jan. 17, 2019

(30) Foreign Application Priority Data

Jul. 14, 2017 (FI) ........................ 20175688

(51) Int. Cl.
| | |
|---|---|
| *H01R 12/77* | (2011.01) |
| *H01R 12/78* | (2011.01) |
| *H01R 12/79* | (2011.01) |
| *H05K 1/02* | (2006.01) |
| *H05K 1/11* | (2006.01) |
| *H05K 3/32* | (2006.01) |

(Continued)

(52) U.S. Cl.
CPC ............ *H01R 12/78* (2013.01); *H01R 12/61* (2013.01); *H01R 12/771* (2013.01); *H01R 12/79* (2013.01); *H05K 1/028* (2013.01); *H05K 1/118* (2013.01); *H05K 3/326* (2013.01); *H05K 3/365* (2013.01); *H05K 3/46* (2013.01); *H05K 3/4697* (2013.01); *H05K 2201/055* (2013.01); *H05K 2201/09109* (2013.01); *H05K 2201/09145* (2013.01); *H05K 2201/10356* (2013.01)

(58) Field of Classification Search
CPC ........ H01R 12/62; H01R 12/79; H01R 12/61; H01R 12/78; H01R 12/771; H05K 1/028; H05K 1/118; H05K 3/326; H05K 3/365; H05K 3/46; H05K 3/4697; H05K 2201/055; H05K 2201/09109; H05K 2201/09145; H05K 2201/10356
USPC ............................ 439/67, 77, 492, 493, 37
See application file for complete search history.

(56) References Cited

U.S. PATENT DOCUMENTS 3,602,870 A * 8/1971 Willard ................. H01R 12/62
                                                        439/493
4,551,579 A   11/1985 Takasaki
(Continued)

FOREIGN PATENT DOCUMENTS

DE      2423144 A1    11/1975
DE     19832011 A1     2/2000
(Continued)

OTHER PUBLICATIONS

Finnish Patent Office, Search report dated Dec. 1, 2017 in a Finnish patent application No. 20175688.
(Continued)

*Primary Examiner* — Gary F Paumen
(74) *Attorney, Agent, or Firm* — Berggren LLP

(57) ABSTRACT

The pocket connector of the invention has been manufactured of a substrate, which is preferably flexible in at least one direction, of which three parts have been prepared, which are bent or assembled from three parts and joined together superimposed so that at least two opposite sides of the pocket connector have coupling apertures. Two flat cables or a connector for a flexible circuit board is connectable to these coupling apertures.

9 Claims, 6 Drawing Sheets

(51) Int. Cl.
  *H05K 3/36*  (2006.01)
  *H05K 3/46*  (2006.01)
  *H01R 12/61* (2011.01)

(56) References Cited

U.S. PATENT DOCUMENTS

| | | | | |
|---|---|---|---|---|
| 5,479,110 | A * | 12/1995 | Crane | G01R 1/0433 |
| | | | | 324/754.07 |
| 7,067,352 | B1 * | 6/2006 | Scheid | H01L 24/24 |
| | | | | 257/E21.705 |
| 2001/0041465 | A1 * | 11/2001 | Szalay | H01R 12/62 |
| | | | | 439/67 |
| 2004/0233581 | A1 | 11/2004 | Poorman | |
| 2011/0094790 | A1 | 4/2011 | Lin et al. | |
| 2013/0037296 | A1 | 2/2013 | Jenrich | |
| 2014/0113463 | A1 * | 4/2014 | Peterson | H01R 12/73 |
| | | | | 439/77 |
| 2017/0170255 | A1 | 6/2017 | Ha et al. | |

FOREIGN PATENT DOCUMENTS

| | | |
|---|---|---|
| EP | 1378964 A2 | 1/2004 |
| WO | 0195752 A1 | 12/2001 |
| WO | 2011135077 A1 | 11/2011 |

OTHER PUBLICATIONS

European Patent Office, Extended Search Report of EP18181855, dated Dec. 19, 2018, 6 pages.

* cited by examiner

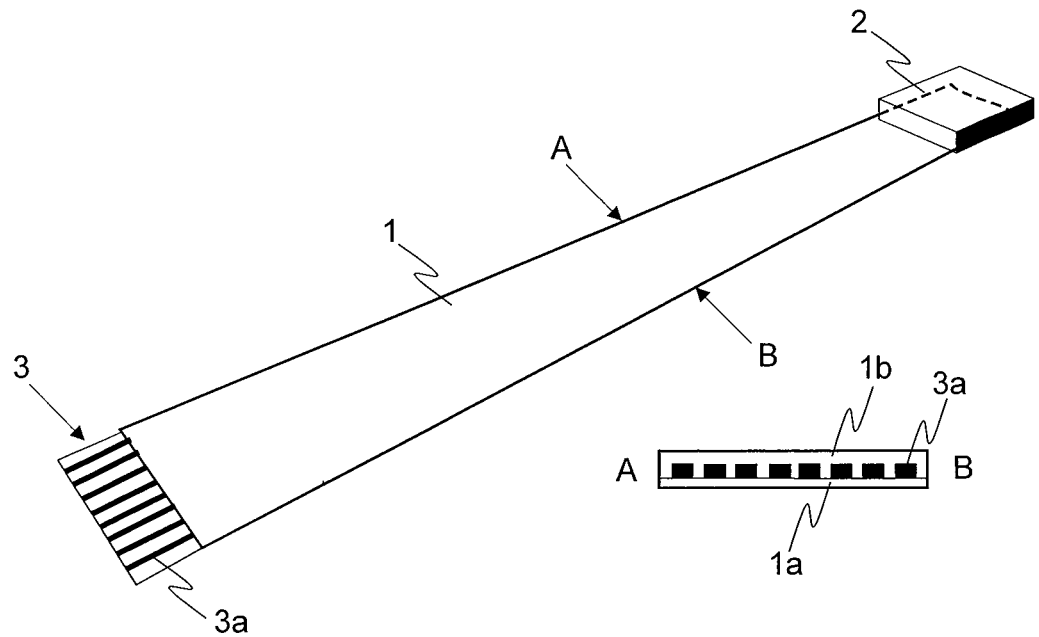
Fig. 1 State of the art
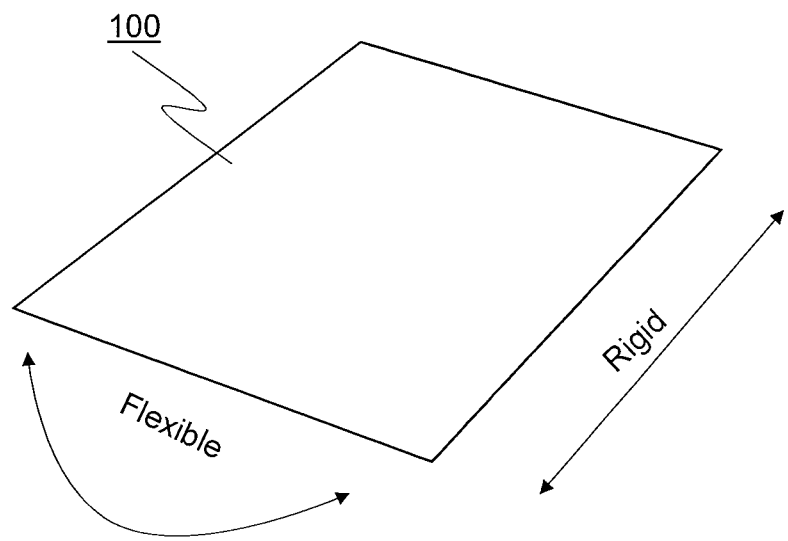
Fig. 2

POCKET CONNECTOR

PRIORITY

This application claims priority of Finnish application FI 20175688 filed on 14 Jul. 2017 the content of which is incorporated herein by reference.

FIELD OF THE INVENTION

The invention relates to a flexible pocket connector, the use of which makes it possible to connect flat cables and/or flexible or rigid circuit boards with each other.

STATE OF THE ART

In flexible flat cables and flexible circuit board structures, either a polyimide-based film (PI), polyester-based film (PET) or polyether sulphone film (PES) are generally used as the flexible substrate. Some polyimide-based trademarks are Kapton®, Apical® and Upilex®. Examples of polyester-based trademarks are Mylar® and Melinex®.

A roll-to-roll manufacturing method can be utilised in the manufacture of flexible flat cables. In the roll-to-roll manufacturing method, film-based cable material is processed in long strips rolled on reels. In the manufacturing apparatus, the different cable manufacturing steps occur in a section arranged between the initial and receiving rolls. There can be several successive manufacturing steps. The roll-to-roll technology is well suitable when the manufacturing batches are big.

Conductors for a flexible flat cable can be manufactured, for example, by growing or etching the conductors containing conductive material onto the flexible conductor substrate used. Traditionally, conductors for flat cables have also been manufactured by rolling from a round wire.

So-called printable electronics can also be used in the manufacture of electrical circuit arrangements. In this manufacturing method, a printing plate or ink material in the printing plate contacts and adheres to the material functioning as the printing bed, i.e. substrate. Removing methods, such as etching, are also included in the manufacturing methods for printable electronics. Ink materials can be electrically conductive or insulating. In case of a flat cable, an electrically insulating material is used, onto which the conductors coming to the flat cable are fabricated of an electrically conductive material, for example, by printing. Electrically conductive and insulating, liquid, gelatinous or powdery materials are available in abundance.

In FIG. 1, there is illustrated an example of a flexible flat cable 1 comprising eight conductors and of a miniature connector 2 according to the state of the art attached to the flat cable. The structure of the flat cable 1 is illustrated in cross-section A-B in FIG. 1. The substrate 1a of the flat cable 1 consists of insulating and flexible material. Eight parallel conductors 3a have been manufactured onto the substrate by state-of-the-art manufacturing methods. A top layer 1b of insulating material has further been prepared onto the conductors 3a. In the described exemplary flat cable 1, the conductors are surrounded by insulator everywhere else except at the conductors that come to the ends of the flat cable. In the example in FIG. 1, a state-of-the-art miniature connector 2 at the first end of the flat cable 1 is illustrated with reference 2. At the second end of the flat cable, reference 3, the connector has not been attached yet so that the conductors 3a of the flat cable 1 can be visible or covered by the insulator 1b, depending on the connector type used.

The state-of-the-art miniature connector 2 comprises a body section extruded from insulating material, inside of which there are as many metallic connectors as there are conductors in the flat cable 1. The miniature connector 2 has clearly bigger dimensions than the flat cable in the direction of width and thickness. Further, the miniature connector 2 is hard and it cannot be bent in any direction. There are applications, in which big flexibility is required for the used cabling as a whole. One example is so-called wearable electronics, which is integrated as part of a piece of clothing. In such an application, a connector solution which is hard and non-bending and which has bigger dimensions than the cable makes the implementation of a system designed for the piece of clothing more difficult.

OBJECTIVES OF THE INVENTION

It is an objective of the invention to present a new, preferably flexible pocket connector, the outer dimensions of which are essentially smaller than those of state-of-the-art miniature connectors. The pocket connector of the invention can be manufactured preferably of one rectangular and insulating substrate, which is flexible in at least one structural direction.

The objectives of the invention are achieved with a pocket connector, which has preferably at least three superimposed rectangular parts of identical size and shape, which are preferably made of insulating material. The part becoming the middlemost part of the pocket connector has been provided with conductive ducts from the upper surface of the middlemost part to its lower surface. Onto the middlemost part there has been bent the first preferably insulating part of the pocket connector as the upper surface of the pocket connector, and the third preferably insulating part of the pocket connector has been bent below the middlemost part as the lower surface of the pocket connector. The substrate material for the pocket connector has been selected so that the pocket connector is flexible in at least one structural direction of the pocket connector. The first cable to be installed in the pocket connector can be installed in the first coupling aperture of the pocket connector, which can be between the preferably insulating part forming the upper surface of the pocket connector and the middlemost part of the pocket connector. In this case, the second cable to be installed in the pocket connector can be installed in the second coupling aperture of the pocket connector, which can be between the preferably insulating part forming the lower surface of the pocket connector and the middlemost part of the pocket connector. The conductive ducts in the middlemost part connect the cable conductors in the first and second coupling aperture.

It is an advantage of the pocket connector of the invention that the electrical connection elements of the pocket connector can be manufactured onto the used substrate by utilising manufacturing methods for printable electronics; for example, the roll-to-roll manufacturing method.

It is a further advantage of the invention that no extrusion steps are needed in the manufacture of the pocket connector, which increase the manufacturing costs of the connector.

It is a further advantage of the invention that the pocket connector yields in at least one structural direction of the pocket connector to ease the connection of the cable coming to the pocket connector or the flexible or rigid circuit board.

It is a further advantage of the invention that the outer dimensions of the pocket connector are essentially smaller than those of state-of-the-art miniature connectors.

It is characteristic of the pocket connector of the invention that the pocket connector comprising a first side, second side, third side and fourth side is arranged to be manufactured by bending from a substrate essentially at least three parts of essentially equal sizes on top of each other so that:
  the bent first part of the substrate forms the upper surface of the connector;
  the second part of the substrate comprises electrical connection elements, which extend through the second part to its both surfaces; and
  the bent third part of the substrate forms the lower surface of the connector; and that
  at least on the second and fourth side of the pocket connector, the first, second and third part of the substrate are connected mechanically together along the entire length of the sides so that:
  in the direction of the first side there is the first coupling aperture of the pocket connector; and
  in the direction of the third side there is the second coupling aperture of the pocket connector;
  connectors for the flat cables have been arranged to be installed to the apertures to generate an electric connection between the connectors for the flat cables through electrical connection elements in the second part.

Some advantageous embodiments of the invention have been illustrated in the dependent patent claims.

The basic idea of the invention is the following: The pocket connector of the invention comprises at least three film-type parts, which have been bent preferably from a compact, insulating substrate so that all film-type parts are essentially superimposed. Two outermost film-type parts form the outer surfaces of the pocket connector. The at least one middlemost film-type part remaining between the outer surfaces comprises the electrical connection elements for the pocket connector, which extend through the middlemost film to its both surfaces.

The edges of the film-type parts bent on top of each other have been attached together on at least two opposite sides so that two coupling apertures are generated to the pocket connector. The said two coupling apertures open to at least two opposite sides of the pocket connector. The coupling apertures are separated from each other in the pocket connector by at least one middlemost film-type part, which has electrical connection elements. The connectors for a flat cable or flexible circuit board to be connected to the first coupling aperture of the pocket connector are electrically connected with the connectors for a flat cable or circuit board connected to the second coupling aperture of the pocket connector through the electrical connection elements in the middlemost film-type part.

In an advantageous embodiment of the invention the reciprocal distance of the connectors for cables to be installed in the pocket connector can differ from each other. In this embodiment coupling points suitable for the cable connectors have been manufactured to the inner layer or layers of the pocket connector by printable electronics.

In an advantageous embodiment of the invention the outer surfaces of the finished pocket connector or film-type parts closest to the outer surface have been coated with an electrically conductive material. In this embodiment the body of the pocket connector of the invention can be connected, for example, to a protective conductor in the flat cable.

BRIEF DESCRIPTION OF THE DRAWINGS

The invention is next explained in more detail. In the specification, reference is made to the attached drawings, in which FIG. 1 illustrates a state-of-the-art flat cable with a miniature connector;

FIG. 2 illustrates the mechanical characteristics of the substrate used in the pocket connector of the invention in different structural directions;

DETAILED DESCRIPTION

Figure 3A:
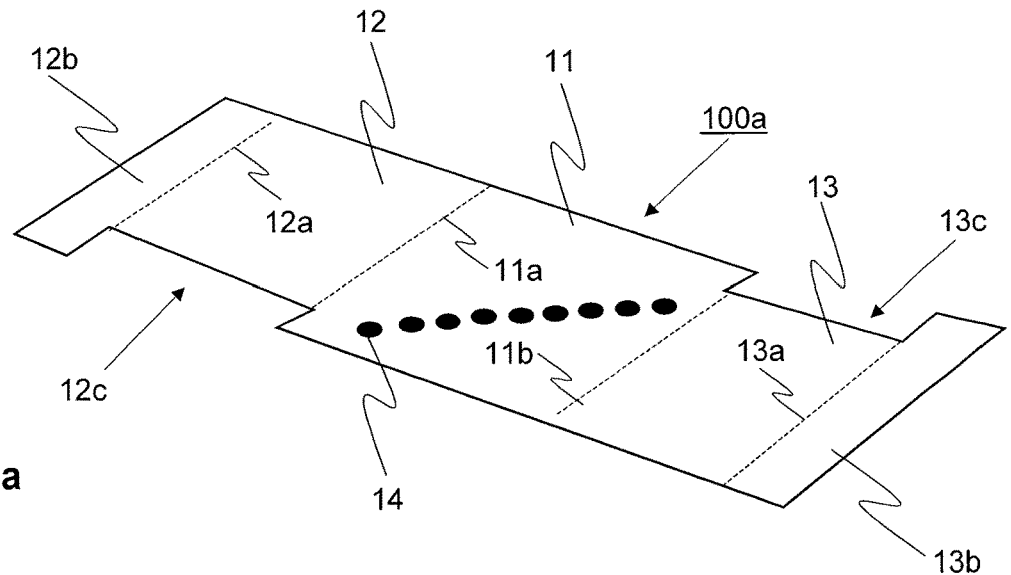
FIGS. 3a-g illustrate in an exemplary manner different manufacturing steps of a pocket connector according to a first embodiment of the invention.

The embodiments in the following specification are only exemplary, and one skilled in the art can implement the basic idea of the invention also in some other way than what has been described in the specification. Even though reference can be made to an embodiment or embodiments in several places in the specification, this does not mean that the reference would only be directed at one described embodiment, or that the described feature would only be feasible on one described embodiment. Individual features of two or several embodiments can be combined and thus it is possible to achieve new embodiments of the invention.

In the following specification, it is mentioned in connection with the pocket connector of the invention that the pocket connector has an upper surface and a lower surface. The purpose of these mentions is to only simplify the specification. Thus, the upper surface and lower surface mentioned later in the specification are not meant to describe the final installation position of the pocket connector of the invention.

FIGS. 2-4d illustrate embodiments of the invention, in which the pocket connector of the invention is fabricated of material in form of a strip. The strip-type material is preferably an insulator, onto the surface of or through which the connector contacts of the pocket connector are prepared. The strip-type material can also be coated at least for some parts with a conductive material to provide the pocket connector with an electrical protective layer.

However, it is obvious for one skilled in the art that the pocket connector of the invention can also be made by joining together insulating and/or conductive film arrangements cut to an appropriate shape.

In FIG. 2 there is illustrated an essentially rectangular substrate 100, of which the pocket connector of the invention can be manufactured. The substrate 100 is preferably an insulating plastic film according to a state of the art, which is used, for example, in the manufacture of printable electronics. The mechanical characteristics of the substrate 100 can advantageously differ from each other considerably in relation to two opposite perpendicular structural directions of the substrate 100. For example, in FIG. 2 the substrate 100 is essentially more rigid in the direction of the first side than in the direction of the second side perpendicular to it, which is more flexible.

In an advantageous embodiment of the invention the substrate 100 also possesses an ability to stretch in its own flexible structural direction so that it is possible to stretch the pocket connector of the invention to said structural direction when a flat cable is being installed in the pocket connector or removed from it.

In a pocket connector of the invention fabricated of the substrate 100, the more rigid structural direction of the substrate 100 is preferably the direction, in which the conductors/connectors for cables or a flexible circuit board to be connected to the pocket connector of the invention are attached to the pocket connector.

The more flexible structural direction of the substrate 100 makes it possible to open the coupling apertures produced to the pocket connector of the invention by bending or pressing the pocket connector in the more flexible structural direction of the substrate 100. In this case, the desired coupling aperture of the pocket connector opens as a consequence of bending. This facilitates the connection of connectors for cables or flexible circuit boards to or their removal from the pocket connector of the invention.

In an advantageous embodiment of the invention part of the second surface of the substrate 100 is coated with electrically conductive material using a manufacturing method of the state of the art. The body part in question can be either a body part belonging to the outer surface of the pocket connector or an electrical protective layer inside the pocket connector.

Figure 5A:
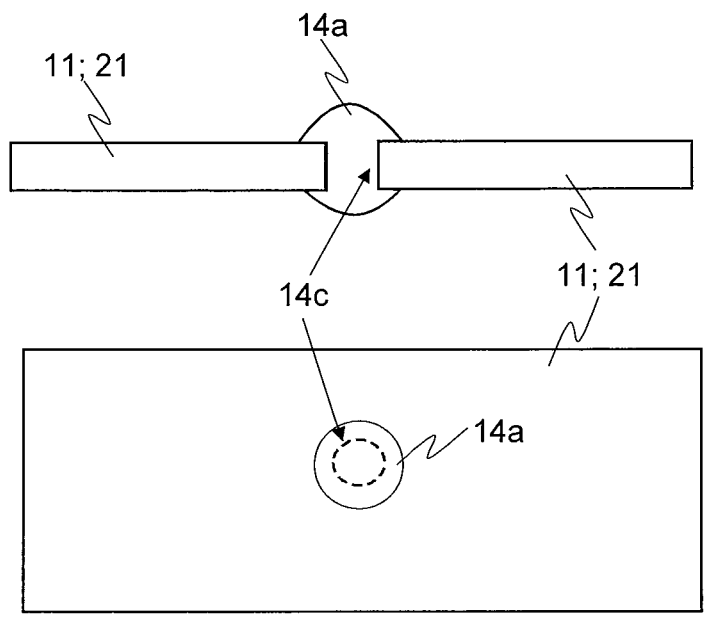
FIGS. 5a-b illustrate in an exemplary manner two different electrical coupling points used in the pocket connector of the invention.
Figure 5B:
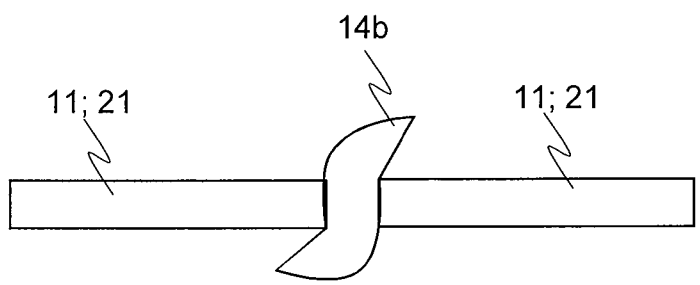
Figure 5C:
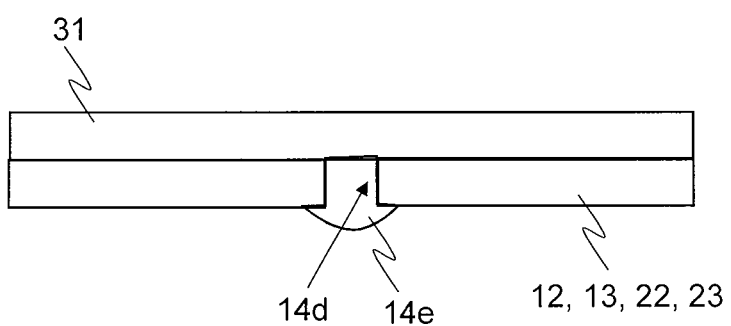
FIG. 5c illustrates in an exemplary manner a solution utilised when connecting the electrical protective layer of the pocket connector to the protective conductor.

In this embodiment, the electrically conductive body part of the pocket connector of the invention can, when needed, be coupled to the protective conductor for a flat cable to be installed in the pocket connector, for example, using the solution illustrated in FIG. 5c.

In FIGS. 3a-3g there are illustrated in an exemplary manner different steps for the manufacture of the pocket connector 10 of the first advantageous embodiment of the invention. For example, polyimide-based film (PI), polyester-based film (PET) or polyether sulphone film (PES) can be used as the substrate 100a for the pocket connector 10 of the invention manufactured according to FIGS. 3a-3g.

The invention is not restricted to the exemplary pocket connector 10 shown in FIG. 3a-3g, the finished pocket connector 10 comprising three parts of the substrate 100a bent on top of each other, but the pocket connector of the invention may have several superimposed substrate parts so that it is possible to connect several cables or flexible circuit boards using the same pocket connector.

With the pocket connector of the invention it is also possible to connect cables, the reciprocal distance of the conductors of which differs from each other. In this advantageous embodiment of the invention, preferably the middlemost film or films of the pocket connector of the invention comprise, for example, wirings made by printing to align the cable coupling points to correspond to the dimensions of the cable.

In FIG. 3a there is illustrated a step for the manufacture of the pocket connector 10 of the first embodiment of the invention, in which there is illustrated the substrate 100a cut to shape, of which the pocket connector 10 of the first embodiment of the invention is fabricated. The substrate 100a can advantageously be manufactured with a roll-to-roll apparatus, from which the substrate 100a of FIG. 3 has been cut for finishing steps.

In the example in FIG. 3a, the substrate 100a is advantageously flexible in its longitudinal direction and rigid in its lateral direction. The compact substrate 100a preferably comprises the first part 11, second part 12 and third part 13 joined together. The three parts of the substrate 100a are almost equal in area, but their shape can advantageously differ in some parts.

In a second advantageous embodiment of the invention, the surfaces of the second part 12 and third part 13 of the substrate 100a, which in the finished pocket connector 10 remain outermost, are coated with an electrically conductive material. In this embodiment, the electrically conductive part of the body of the pocket connector 10 of the invention can be coupled to the protective conductor for a flat cable installed in the pocket connector 10 with a solution illustrated in FIG. 5c, when needed. This advantageous embodiment has not been illustrated in more detail in FIGS. 3a-3g.

The first part 11 of the substrate 100a comprises in the finished pocket connector 10 electrical coupling instruments belonging to it for electrically connecting conductors or connectors for two cables or flexible circuit boards in a desired way to each other. In FIG. 3a, the electrical coupling instruments have been implemented by means of electrically conductive coupling points 14. The coupling points 14 are separate coupling points 14 extending through the first part 11 of the substrate 100a, of which there are 9 in the example in FIG. 3a. The grouping and locations of the coupling points 14 illustrated in FIG. 3a are exemplary.

The electrical coupling points 14 included in the first part of the substrate 100a are preferably made by using the roll-to-roll manufacturing process before cutting the substrate 100a to shape. The ducts through the first part 11 of the substrate 100a have preferably been manufactured first with the roll-to-roll manufacturing process for all electrical coupling points 14 needed in the pocket connector of the invention, for example, by die cutting or laser. In the second step, the electrical coupling points 14 of the pocket connector are prepared preferably by pressing electrically conductive material to through holes fabricated to the first part 11 of the substrate 100a.

The conductive material pressed into the through holes provide an electrically conductive connection from the first surface (upper surface) of the first part 11 of the substrate 100a to its second surface (lower surface). Silver paste, for example, can be advantageously used as the electrically conductive material for fabricating the coupling points 14.

The second part 12 of the substrate 100a forms the upper surface in the finished pocket connector 10, and its total area may be slightly bigger than the first part 11 of the substrate 100a, because it may preferably also include in a bending part 12b.

In the example in FIG. 3a, the second part 12 of the substrate 100a has been provided with a slot 12c. In another advantageous embodiment of the invention there is no slot 12c. The slot 12c extends from the bending line 11a between the first part 11 and second part 12 up to the bending line 12a in the second part 12. The length of the slot 12c is essentially equal to the length of the side of the substrate's first part 11 in the direction of the longer side of the slot 12c. The depth of the slot 12c is selectable according to the requirements of the pocket connector to be manufactured.

The bending part 12b preferably belonging to the second part 12 of the substrate 100a behind the bending line 12a is arranged to be bent to the lower surface of the pocket connector 10 in the final manufacturing steps of the pocket connector 10, where it can be attached, for example, with glue.

The third part 13 of the substrate 100a forms the lower surface in the finished pocket connector 10. The third part 13 of the substrate 100a can also have a slightly bigger total area than the first part 11 of the substrate 100a, because it can also include an own bending part 13b.

The shape of the third part 13 of the substrate 100a is a mirror image of the second part 12 of the substrate 100a. The third part 13 of the substrate 100a is also provided with a slot 13c. In another advantageous embodiment of the invention there is no slot 13c. The slot 13c extends from the bending line 11b between the first part 11 and third part 13 to the bending line 13a in the third part 13. The length of the slot 13c is essentially equal to the length of the side of the substrate's first part in the direction of the longer side of the slot 13c. The depth of the slot 13c can be selected according to the requirements of the pocket connector to be manufactured.

The bending part 13b advantageously belonging to the third part 13 of the substrate 100a behind the bending line 13a is arranged to be bent onto the upper surface of the pocket connector 10 in the final manufacturing steps of the pocket connector 10, where it is attached, for example, with glue.

Figure 3B:
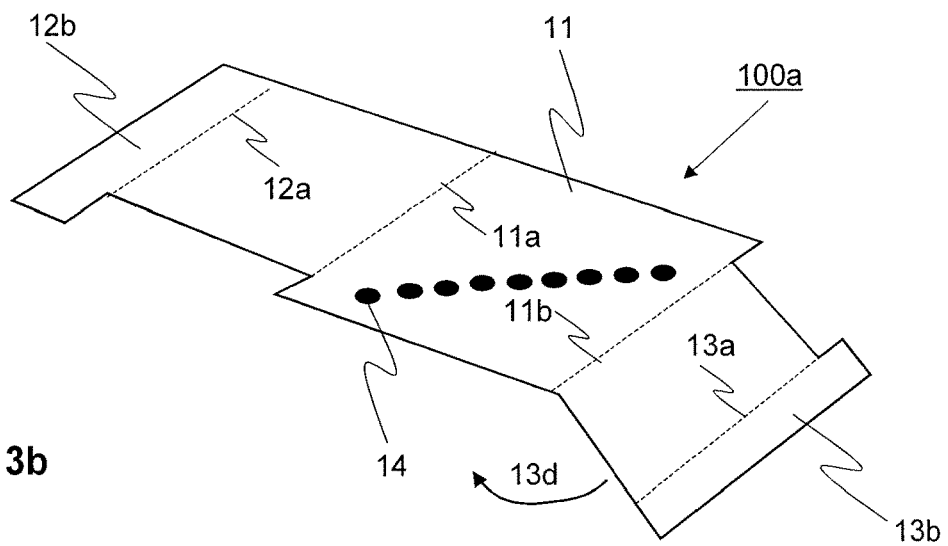

In FIG. 3b there is illustrated a step for the manufacture of the pocket connector 10, in which the third part 13 of the substrate 100a has been bent downwards somewhat in the direction of arrow 13d at the bending line 11b separating from each other the first part 11 and the third part 13 of the substrate 100a. In the finished pocket connector 10, the said bending line 11b forms the second side 17 of the pocket connector 10.

Figure 3C:
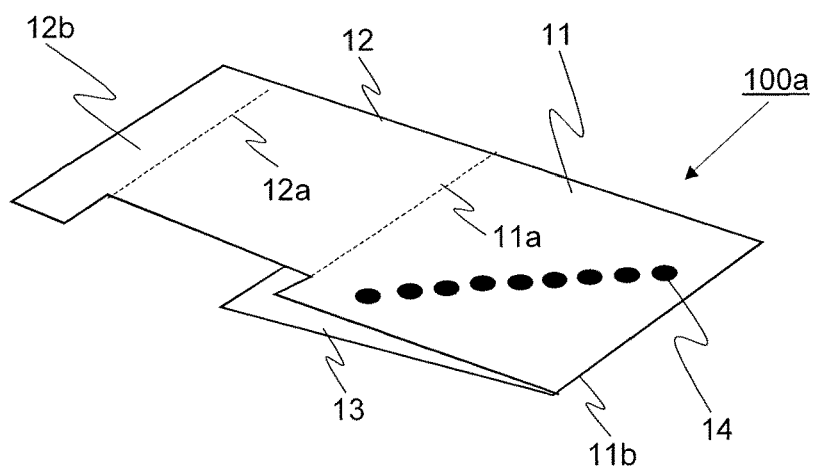

In FIG. 3c there is illustrated a step for the manufacture of the pocket connector 10, in which the third part 13 of the substrate 100a has been bent almost in its entirety below the first part 11 of the substrate 100a.

Figure 3D:
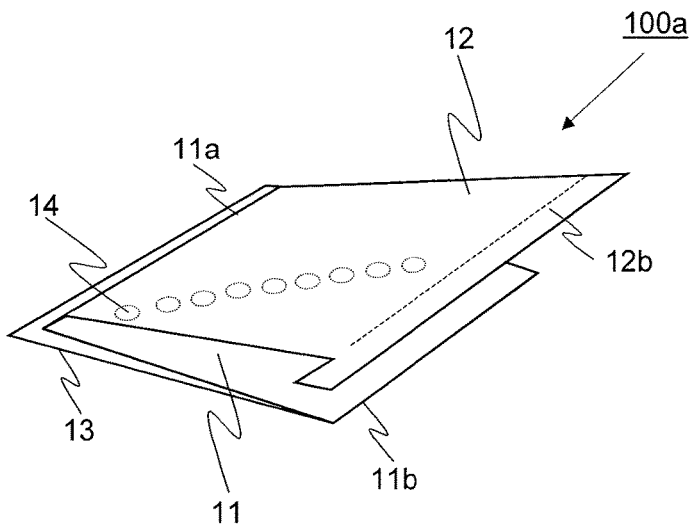

In FIG. 3d there is illustrated a step for the manufacture of the pocket connector 10, in which the second part 12 of the substrate 100a has been bent almost entirely above the first part 11 of the substrate 100a. The second part 12 of the substrate 100a has been bent at the bending line 11a separating from each other the first part 11 and the second part 12 of the substrate 100a. In the finished pocket connector 10, the bending line 11a forms the fourth side 19 of the pocket connector 10.

Figure 3E:
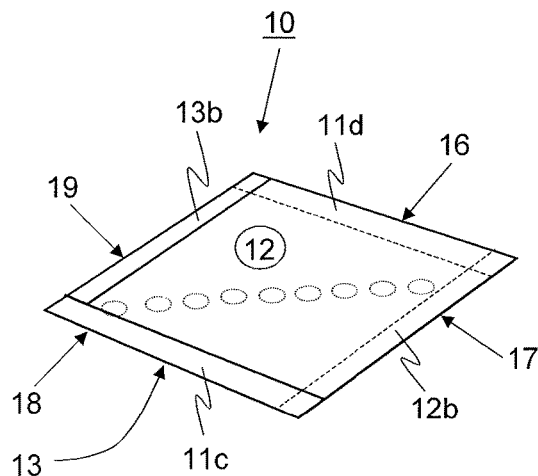

In FIG. 3e there is illustrated a step for the manufacture of the pocket connector 10, in which the second part 12 of the substrate 100a has been bent entirely on top of the first part 11 of the substrate 100a and the third part of the substrate 100a has been bent in its entirety below the first part 11 of the substrate 100a. From the side of the fourth side 19 of the pocket connector 10, the bending part 13b of the third part 13 of the substrate 100a has further been bent onto the second part 12 of the substrate 100a. Respectively, the bending part 12b (broken line) of the second part 12 of the substrate 100a on the second side 17 of the pocket connector 10 has been bent onto the third part 13 of the substrate 100a on the lower surface of the pocket connector 10.

In this manufacturing step, on the upper surface of the third side 18 of the pocket connector 10 there preferably remains a bare sector 11c of the first part 11 of the substrate 100a, which is not covered by the second part 12 of the substrate 100a because of the slot 12c in it.

Respectively, on the lower surface of the first side 16 of the pocket connector 10 there advantageously remains a bare sector 11d (broken line) of the first part 11 of the bare substrate 100a, which is not covered by the third part 13 of the substrate 100a because of the slot 13c.

Figure 3F:
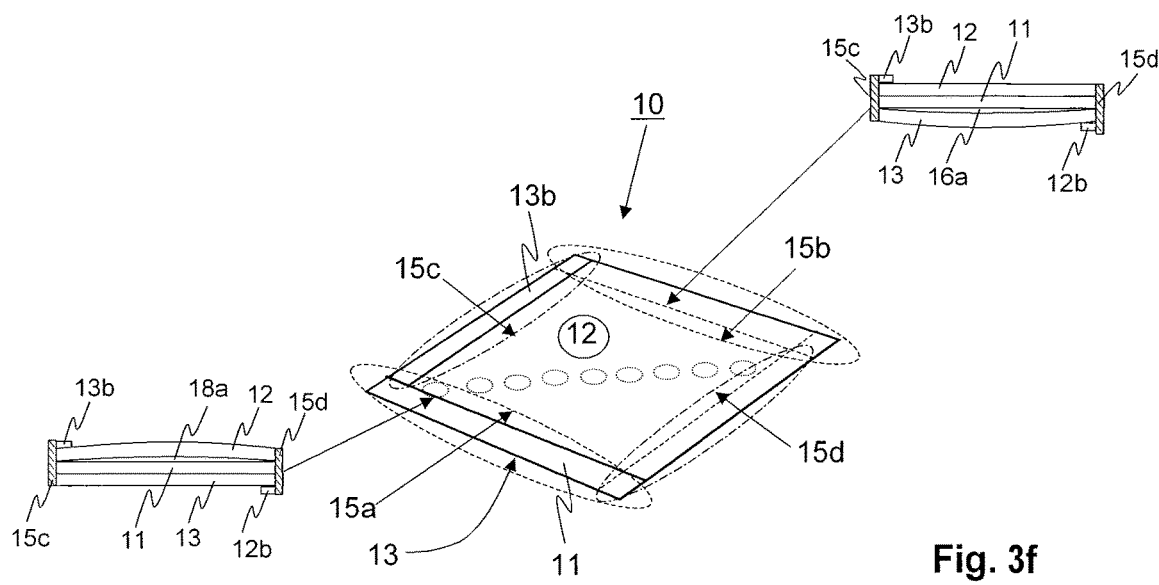

In FIG. 3f there is illustrated the pocket connector 10 of the invention after its first side 16, second side 17, third side 18 and fourth side 19 have been attached mechanically to each other, for example, with glue. The first side 16 and the third side 18 of the pocket connector 10 are on opposite sides of the pocket connector 10.

Respectively, the second side 17 and the fourth side 19 are on opposite sides of the pocket connector 10. In the example in FIG. 3f, the structural direction of the first side 16 and third side 18 of the pocket connector 10 is at a 90-degree angle to the structural direction of the third side 18 and fourth side 19.

Reference 15b illustrates a connection, with which the first part 11 and second part 12 of the substrate 100a for the pocket connector 10 have been joined together along the entire length of the first side 16 of the pocket connector 10 at least at the edge parts. In this case, a first open coupling aperture 16a of the pocket connector 10 has been achieved between the first part 11 and third part 13 of the substrate 100a of the pocket connector 10.

On the third side 18 of the pocket connector, reference 15a illustrates a connection, with which the first part 11 and third part 13 of the substrate 100a for the pocket connector 10 have been joined together along the entire length of the third side 18 of the pocket connector 10 at least at the edge parts. In this case, a second open coupling aperture 18a has been achieved between the first part 11 and second part 12 of the substrate 100a of the pocket connector 10.

On the second side 17 and fourth side 19 of the pocket connector 10 there are located the first part 11, second part 12 and third part 13 of the pocket connector 10 joined together at their edges along the entire length of said sides, references 15c and 15d.

In FIG. 3f, there is also illustrated the attachment of the bending 12b, which is part of the second part 12 of the substrate 100a, onto the third part 13 on the lower surface of the pocket connector 10. Respectively, there is also shown the attachment of the bending part 13b, which is part of the third part 13 of the substrate 100a, onto the second part 12 of the substrate 100a on the upper surface of the pocket connector 10. Both connections mentioned above have advantageously been achieved when joining together the edge parts of the sides 17 and 19.

The finished pocket connector 10 of the invention preferably has a thickness of 0.3-1.0 mm, and its width can be approximately 30 mm.

The substrate 100a used in the finished pocket connector 10 of the invention yields when the pocket connector 10 is pressed or twisted from the second side 17 and fourth side 19 towards each other. On the other hand, the pocket connector 10 has a more rigid structure in the direction of its first side 16 and third side 18, due to the orientation of its material and to the joining of the second side 17 and fourth side 19 of the pocket connector 10. The rigidity of the pocket connector 10 of the invention in the direction of installation facilitates the coupling of flexible flat cables or flexible circuit boards to or their removal from the pocket connector.

Figure 3G:
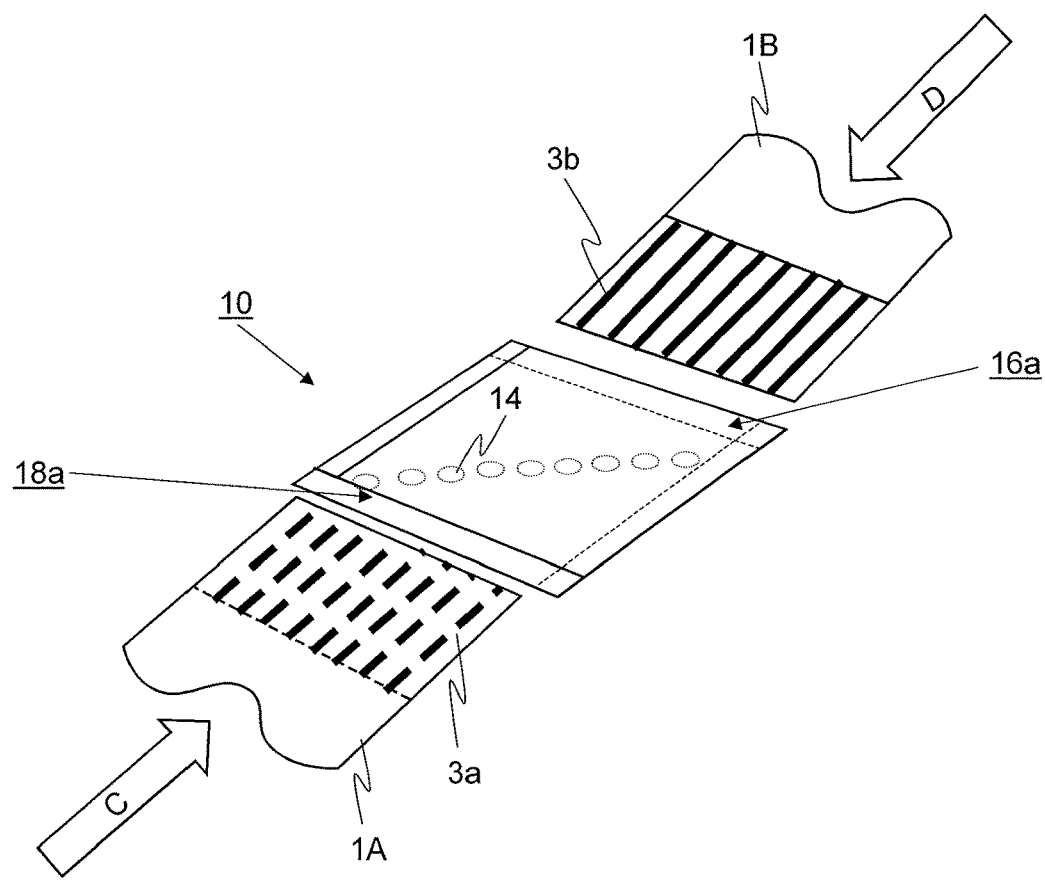

In FIG. 3g there is an example of the coupling of two flexible flat cables 1A and 1B to the pocket connector 10 of the invention. The flat cable 1A is installed to the coupling aperture 18a of the pocket connector 10 from direction C so that its bare conductors 3a face the upper side of the first part 11 of the substrate 100a for the pocket connector 10. In this case, each conductor 3a of the flat cable 1A is only in contact with its own coupling point 14 in the first part 11 of the pocket connector substrate 100a on the upper surface of the first part 11 of the substrate 100a.

The flat cable 1B is installed from direction D to the coupling aperture 16a of the pocket connector 10 so that its bare conductors 3b face the lower surface of the first part 11 of the substrate 100a for the pocket connector 10. In this case each conductor 3b of the flat cable 1B is only in contact with its own coupling point 14 in the first part 11 of the pocket connector substrate 100a on the lower surface of the first part 11 of the substrate 100a.

The installation of the flat cables 1A and 1B to the pocket connector 10 according to the first embodiment of the invention can be facilitated by pressing the second side 17 and fourth side 19 of the pocket connector 10 towards each other. When both flat cables 1A and 1B have been installed in place, the conductors 3a of the flat cable 1A have been coupled electrically to the conductors 3b of the flat cable 1B through the electrical coupling points 14 in the first part 11 of the substrate 100a of the pocket connector 10.

In the example shown in FIGS. 3a-3g, the substrate 100a and the finished pocket connector 10 have three parts; the first part 11, second part 12 and third part 13, which are superimposed. However, the invention is not restricted to the three-partite solution described above. The pocket connector of the invention can also comprise more superimposed parts than what has been described in the example described above. By using a substrate 100, of which it is possible to overlay more than three layers, it is possible to manufacture such a pocket connector of the invention, to which flat cables can be coupled preferably in the same or different direction or from coupling apertures superimposed in the same direction, which are made possible by several parts of the substrate 100.

In an advantageous embodiment of the invention, a spring-loaded part has been installed between the first part 11 and second part 12 and/or the first part 11 and third part 13 for increasing or decreasing the force required to mechanically detach the flat cable to be connected to the pocket connector of the invention.

With the pocket connector 10 of the invention it is also possible to connect cables, the reciprocal distance of the conductors for which differs from each other. In this advantageous embodiment of the invention, preferably the middlemost film or films of the pocket connector of the invention comprise wirings produced, for example, by pressing to align the cable coupling points to correspond to the cable dimensions.

In FIGS. 4a-4d there is illustrated in an exemplary manner different manufacturing steps for a pocket connector 20 according to a second advantageous embodiment of the invention. Polyimide-based film (PI), polyester-based film (PET) or polyether sulphone film (PES) can, for example, be used as the substrate 100b for the pocket connector 20 of the invention.

Figure 4A:
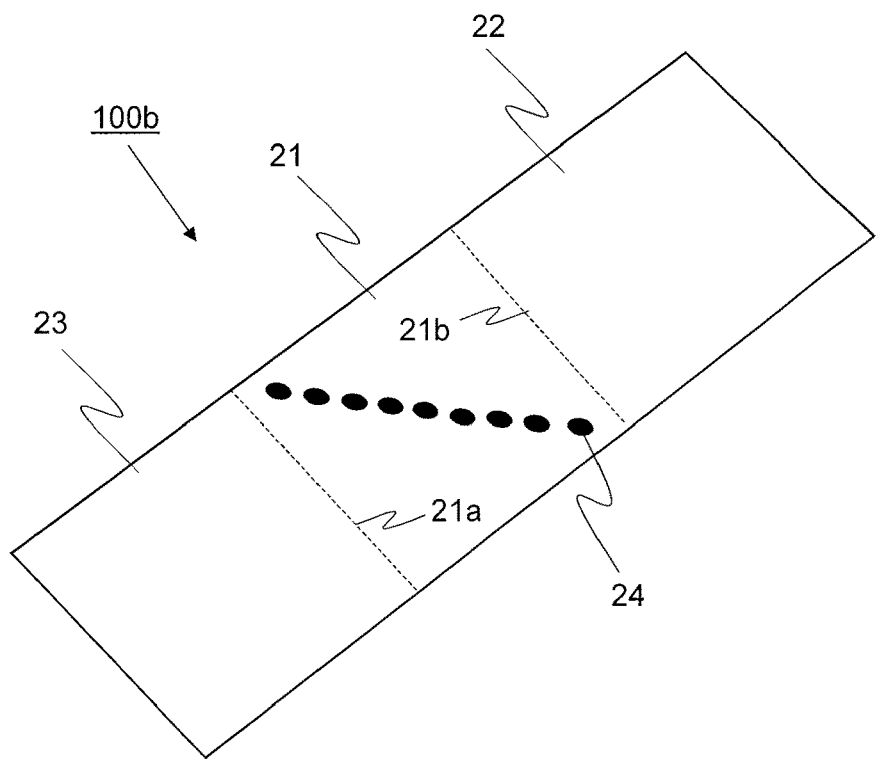
FIGS. 4a-d illustrate in an exemplary manner different manufacturing steps of a pocket connector according to a second embodiment of the invention.

In FIG. 4a there is illustrated a manufacturing step for the pocket connector 20 according to the first embodiment of the invention, in which there is shown the substrate 100b cut to shape, of which the pocket connector 20 according to the second embodiment of the invention is manufactured. The substrate 100b can preferably be made with a roll-to-roll manufacturing apparatus, from which the substrate 100b in FIG. 4a has been cut.

In the example in FIG. 4a, the substrate 100b is preferably flexible in its direction of width and more rigid in its longitudinal direction. The compact substrate 100b comprises preferably the first part 21, second part 22 and third part 23 connected to each other. The three parts of the substrate 100b are almost equal in area, but their shapes can preferably differ from each other for some parts.

In a second advantageous embodiment of the invention, the surfaces of the second part 22 and third part 23 of the substrate 100b, which remain outermost in the finished pocket connector 20, can be coated with an electrically conductive material. In this embodiment, when needed, the electrically conductive part of the body of the pocket connector 20 can be coupled to the protective conductor of a flat cable installed in the pocket connector 20 with a solution illustrated in FIG. 5c. This advantageous embodiment has not been described in more detail in FIGS. 4a-3d.

The first part 21 of the substrate 100b comprises in the finished pocket connector 20 electrical connection elements belonging to it for connecting conductors or connectors for two flat cables or a flexible circuit board electrically to each other in a desired manner. In FIG. 4a, the electrical connection elements have been implemented by means of electrically conductive coupling points 24. The electrical coupling points are separate coupling points 24 extending through the first part 11 of the substrate 100b, of which there are nine in the example in FIG. 4a. The grouping and locations of the coupling points 24 illustrated in FIG. 4a are exemplary.

The electrical coupling points 24 included in the first part 21 of the substrate 100b are preferably made by using a roll-to-roll manufacturing process before cutting the substrate 100b to shape. Ducts have preferably first been manufactured through the first part 21 of the substrate 100b with the roll-to-roll manufacturing process for all electrical coupling points 24 needed in the pocket connector 20 of the invention, for example, by die cutting or laser. In the second step the electrical coupling points 24 of the pocket connector 20 have been produced preferably by pressing electrically conductive material into through-holes fabricated into the first part 21 of the substrate 100b. With the conductive material pressed into the through-holes it is possible to achieve an electrically conductive connection from the first surface (upper surface) of the first part 21 of the substrate 100b to its second surface (lower surface). Silver paste can preferably be used as the electrically conductive material to produce the coupling points 24.

The second part 22 of the substrate 100b forms the upper surface in the finished pocket connector 20 and its total area can be slightly smaller than the first part 21 of the substrate.

The second part 22 of the substrate 100b behind the bending line 21b of the substrate 100b has been arranged to be bent onto the first part 21 of the substrate 100b in the final steps of the manufacture of the pocket connector 20 so that it forms the upper surface of the finished pocket connector 20.

The third part 23 of the substrate 100b has been arranged to be bent from the bending line 21a on the substrate 100b below the first part 21 of the substrate 100b. In this case, the third part 23 of the substrate 100b forms the lower surface of the finished pocket connector 20. The third part 23 of the substrate 100b can also have a smaller total area than the first part 21 of the substrate 100b.

Figure 4B:
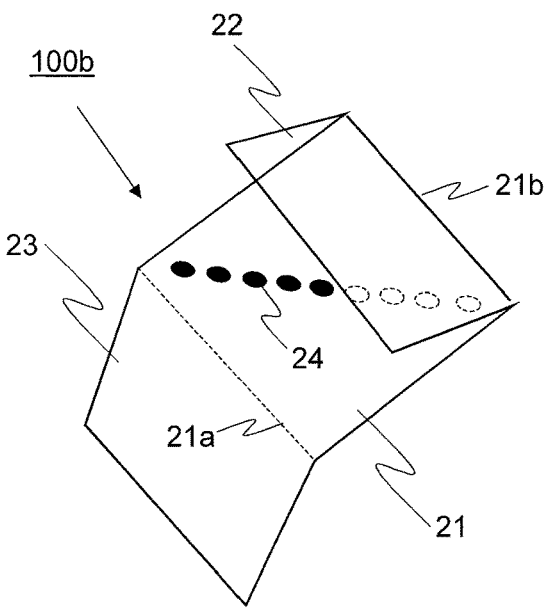

In FIG. 4b there is illustrated a manufacturing step for the pocket connector 20, in which the third part 23 of the substrate 100b has been bent downwards somewhat at the bending line 21a separating from each other the first part 21 and third part 23 of the substrate 100b. In the finished pocket connector 20, said bending line 21a forms the third side 28 of the pocket connector 20.

In FIG. 4b, the second part 22 of the substrate 100b has been bent upwards somewhat at the bending line 21b separating the first part 21 and second part 22 of the substrate 100b. In the finished pocket connector 20, said bending line 21b forms the first side 26 of the pocket connector 20.

Figure 4C:
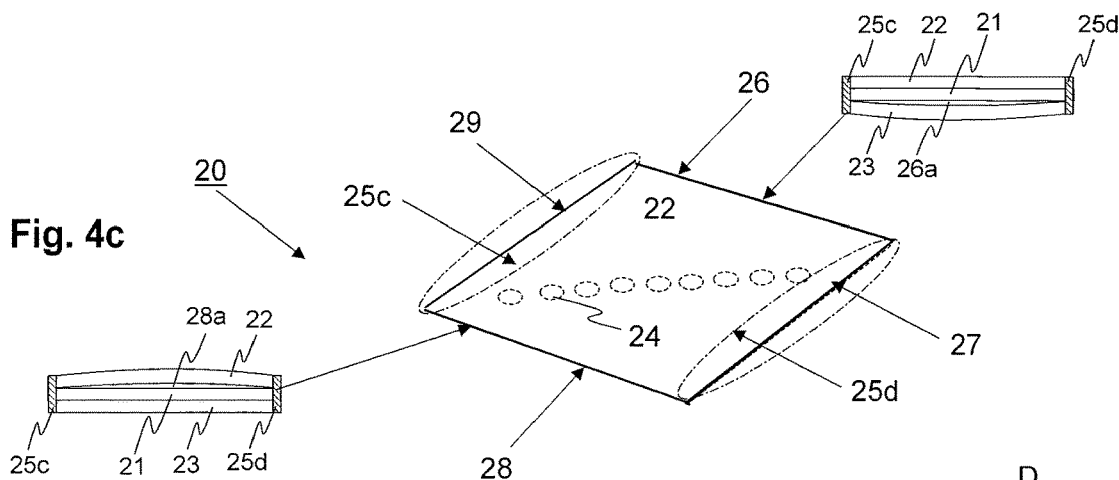

In FIG. 4c there is illustrated a manufacturing step for the pocket connector 20, in which the second part 22 of the substrate 100b has been bent in its entirety onto the first part 21 of the substrate 100b and the third part 23 of the substrate 100b below the first part 21 of the substrate 100b.

The first side 26, second side 27, third side 28 and fourth side 29 of the pocket connector 20 thus formed have been attached mechanically to each other, for example, with glue. The first side 26 and third side 28 of the pocket connector 20 are on opposite sides of the pocket connector. Respectively, the second side 27 and fourth side 29 are on opposite sides of the pocket connector 20. In the example in FIG. 4c, the structural direction of the first side 26 and third side 28 of the pocket connector 20 is at a 90-degree angle to the structural direction of the third side 28 and fourth side 29.

On the second side 27 and fourth side 29 of the pocket connector, the first part 21, second part 22 and third part 23 of the substrate 100b for the pocket connector 20 have been attached mechanically from their edge parts along the entire length of said sides, for example, by gluing; references 25c and 25d.

After the second side 27 and fourth side 29 of the pocket connector 20 have been joined mechanically, a first open coupling aperture 26a of the pocket connector 20 has been formed between the first part 21 and third part 23 of the substrate 100b for the pocket connector 20. A second coupling aperture 28a of the pocket connector 20 has simultaneously formed between the first part 21 and second part 22 of the substrate 100b of the pocket connector 20.

The finished pocket connector 20 of the invention preferably has the thickness of 0.3-1.0 mm, and its width can be approximately 30 mm.

The substrate 100b used in the finished pocket connector 20 according to the second embodiment of the invention yields when the pocket connector 20 is pressed or twisted from the second side 27 and fourth side 29 of the pocket connector 20 towards each other. On the other hand, the pocket connector 20 has a more rigid structure in the direction of the first side 26 and third side 28 of the pocket connector 20 both because of its orientation of material and the joining of the edge parts of the second side 27 and fourth side 29 of the pocket connector 20. The rigidity of the pocket connector 20 of the invention in the direction of installation facilitates the coupling of flexible flat cables or flexible circuit boards to or their detachment from the pocket connector.

Figure 4D:
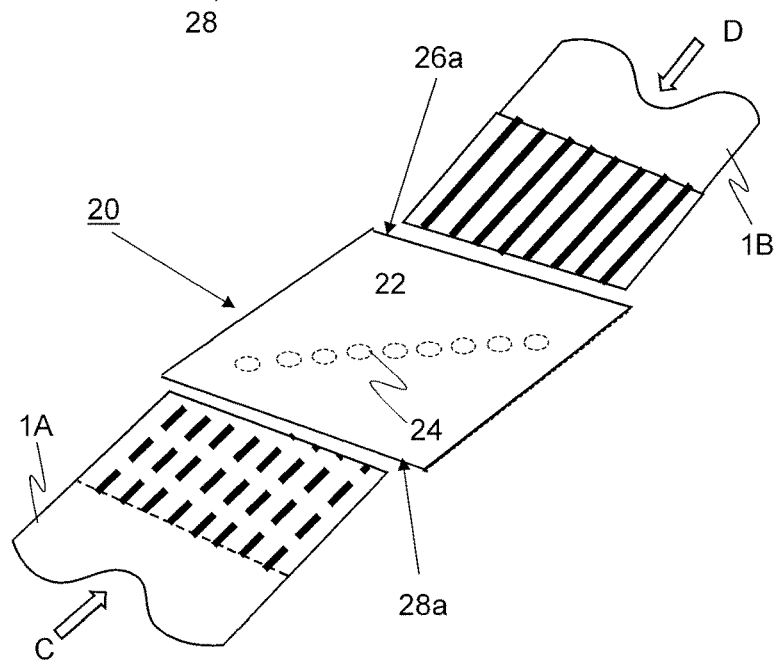

In FIG. 4d there is illustrated an example of the coupling of two flexible flat cables 1A and 1B to the pocket connector 20 according to a second advantageous embodinvent of the invention. The flat cable 1A is installed into the second coupling aperture 28a of the pocket connector 20 from direction C so that its bare conductors face the upper surface of the first part 21 of the pocket connector 20. In this case, each conductor for the flat cable 1A is only in contact with its own coupling point 24 on the outer surface of the first part 21 of the substrate 100b located in the first part 21 of the substrate 100b of the pocket connector 20.

The flat cable 1B is installed into the first coupling aperture 26a of the pocket connector 20 from direction D so that its bare conductors face the lower surface of the first part 21 of the substrate 100b of the pocket connector 20. In this case, each conductor of the flat cable 1B is in contact with its own coupling point 24 on the lower surface of the first part 21 of the substrate 100b located in the first part 21 of the substrate 100b of the pocket connector 20.

The installation of the flat cables 1A and 1B into the pocket connector 20 according to the second advantageous embodiment of the invention can be facilitated by pressing the second side 27 and fourth side 29 of the pocket connector 20 towards each other. When both flat cables 1A and 1B have been installed in place, the conductors of the flat cable 1A have been coupled electrically to the conductors of the flat cable 1B through the electrical coupling points 24 in the first part 21 of the substrate 100b of the pocket connector 20.

Cables, the reciprocal distance of the conductors of which differs from each other, can also be joined together with the pocket connector 20 of the second embodiment of the invention. In this advantageous embodiment of the invention, preferably the middlemost film or films of the pocket connector of the invention comprise wirings made, for example, by pressing the wirings to align the cable coupling points to correspond to the cable dimensions.

In FIG. 5a there is illustrated the electrical coupling point 14a fabricated to an exemplary duct 14c of the first part 11 or 21 of the substrate 100a or 100b in the pocket connector 10 or 20 of the invention.

The ducts 14c to be made to the first part of the substrate 100a or 100b are preferably circular in shape. The exterior of the finished electrical coupling point 14 is impacted by how the surface of the first part 11 or 21 of the substrate 100a or 100b around the ducts 14c has been processed; i.e. whether the surface of the first part 11 or 21 of the substrate 100a or 100b around the ducts 14c is attracting or rejecting the surface in relation to the electrically conductive material.

If the environment of the ducts 14c has been adjusted so that the surface of the first part 11 or 21 in the environment of the ducts is attracting the surface in relation to the electrically conductive material so that in this case, the electrically conductive material dispensed to the duct 14c forms a low, flat electrical coupling point 14 on both sides around the ducts 14c of the first part 11 or 21.

If the environment of the ducts 14c has been adjusted so that the surface of the environment is rejecting the surface in relation to the electrically conductive material so that in this case, the electrically conductive material dispensed to the duct 14c forms an electrical coupling point 14a in accordance with FIG. 5a, the diameter of which is slightly bigger than the duct 14c. On the other hand, the coupling point 14a formed to the duct 14c rises substantially upwards from both surfaces of the first part 11 or 21 of the substrate 100a or 100b in the ducts 14c. Such a coupling point 14a forms a reliable contact with the conductors of the flat cable installed in the pocket connector 10 or 20.

In FIG. 5b there is illustrated a second exemplary electrical coupling point 14b fabricated to the exemplary duct 14c of the first part 11 or 21 of the substrate 100a or 100b in the pocket connector 10 or 20 of the invention.

In the advantageous embodiment in FIG. 5b the electrical duct has been produced with a metal connector 14b, which is a crimp connection or which has been pressed through the first part 11 or 21 of the substrate 100a or 100b of the pocket connection 10 or 20. The metal connector 14b has been shaped so that the installation of the flat cable in the pocket connector 10 or 20 is guided from the direction of the convex half of the metal connector 14b. In this case, the metal connector 14b does not really resist the installation of the flat cable in the pocket connector 10 or 20. On the other hand, the flat cable stays well in place, because the sharp point of the metal connector 14b resists the movement of the flat cable outwards from the pocket connector 10 or 20.

In FIG. 5c there is illustrated how the conductive layer 31 on the outer surfaces of the second part 12, 22 and/or third part 13, 23 of the substrate 100a or 100b in the pocket connector 10 or 20 of the invention is connectable, for example, to the protective conductor of the flat cable coupled to the pocket connector 10 or 20.

The conductive layer 31 can preferably be laminated metal film, such as copper, or conductive material grown or pressed onto one surface of the substrate 100a or 100b. In this advantageous embodiment, a duct 14d has been prepared to the secand part 12, 22 and/or third part 13, 23 of the substrate 100a or 100b in the same connection as the ducts for the coupling points 14 or 24 to the first part 11 or 21 of the substrate 100a or 100b. The duct 14d is preferably fillable with electrically conductive material in the same connection as the ducts 14 or 24 in the first part 11 or 21 of the substrate 100a or 100b have been filled with electrically conductive material.

When a flat cable with a protective conductor is connected to the pocket connector 10 or 20 of the invention, the coupling point 14e in the second part 12, 22 and/or third part 13, 23 of the substrate 100a or 100b forms an electrical connection to the protective conductor of the flat cable. With the generated coupling, the conductive parts of the body of the pocket connector 10 or 20 of the invention have been connected to earth potential through the protective conductor of the flat cable.

Some advantageous embodiments of the pocket connector of the invention have been described above. The invention is not restricted to these described solutions, but the inventive idea can be applied in several ways within the scope set by the claims.

The invention claimed is:

1. Pocket connector, which is made of a compact, insulating and essentially rectangular substrate,
wherein the pocket connector with a first side, second side, third side and fourth side is arranged to be manufactured by bending from the substrate essentially at least three equal parts on top of each other so that:
a first part of the substrate comprises electrical coupling points extending through the first part to its both surfaces;
a second part of the substrate bent above the first part of the substrate forms the upper surface for the pocket connector; and
a third part of the substrate bent below the first part of the substrate forms the lower surface for the pocket connector; and that
at least on the second side and fourth side of the pocket connector, the first, second and third part of the substrate has been mechanically joined together along the entire length of the sides so that:
there is the first coupling aperture in the direction of the first side of the pocket connector; and
there is the second coupling aperture in the direction of the third side of the pocket connector;
cables are arranged to be installed in these coupling apertures to generate an electrical connection between the conductors of the cables through the electrical coupling points in the first part of the substrate.

2. Flexible pocket connector according to claim 1, wherein further in the pocket connector:
the first part and second part of the substrate have been mechanically joined together along the entire length of the side on the first side of the pocket connector; and
the first part and third part of the substrate have been mechanically joined together along the entire length of the side on the third side of the pocket connector, the connections being arranged to achieve:
the first coupling aperture of the pocket connector in the direction of the first side between the first part and third part of the substrate of the pocket connector; and
the second coupling aperture of the pocket connector in the direction of the third side between the first part and second part of the substrate of the pocket connector.

3. Pocket connector according to claim 2, wherein the first, second and third part of the substrate of the pocket connector are flexible at least in the direction of the first side and third side of the pocket connector to enable the coupling of the cables.

4. Pocket connector according to claim 3, wherein that the first, second and third part of the substrate of the pocket connector are also stretchable at least in the direction of the first side and third side of the pocket connector to enable the coupling of the cables.

5. Pocket connector according to claim 4, wherein the thickness of the pocket connector is 0.3-1.0 mm and the maximum width approximately 40 mm.

6. Pocket connector according to claim 1, wherein the second part and/or third part of the substrate have on their outer surfaces an electrically conductive layer, which is arranged to be coupled to the protective conductor for the flat cable coupled to the pocket connector to electrically protect the pocket connector through the coupling point prepared to the second part and/or to the third part of the substrate.

7. Pocket connector according to claim 1, wherein the first part of the substrate of the pocket connector comprises wirings made by pressing to align the coupling points of the cables to be joined together to correspond to the conductor distances of the cables.

8. Pocket connector according to claim 1, wherein the pocket connector substrate has more than three equally sized substrate parts of the substrate on top of each other so that more than two coupling apertures can be manufactured to the pocket connector.

9. Pocket connector according to claim 1, wherein the substrate is flexible in at least one structural direction and that the substrate is made of film-type material, which is one of the followings: polyimide-based film, polyester-based film or polyether sulphone-based film.

* * * * *